United States Patent

Ohkuri et al.

(10) Patent No.: US 7,209,002 B2
(45) Date of Patent: Apr. 24, 2007

(54) AUDIO AMPLIFIER

(75) Inventors: Kazunobu Ohkuri, Kanagawa (JP); Toshihiko Masuda, Tokyo (JP)

(73) Assignee: Sony Corporation, Tokyo (JP)

( * ) Notice: Subject to any disclaimer, the term of this patent is extended or adjusted under 35 U.S.C. 154(b) by 106 days.

(21) Appl. No.: 10/536,999

(22) PCT Filed: Dec. 12, 2003

(86) PCT No.: PCT/JP03/15916

§ 371 (c)(1),
(2), (4) Date: May 31, 2005

(87) PCT Pub. No.: WO2004/057757

PCT Pub. Date: Jul. 8, 2004

(65) Prior Publication Data

US 2005/0285670 A1 Dec. 29, 2005

(30) Foreign Application Priority Data

Dec. 20, 2002 (JP) ............................. 2002-369703

(51) Int. Cl.
*H03F 3/38* (2006.01)
(52) U.S. Cl. ..................... 330/10; 330/207 A; 330/251
(58) Field of Classification Search ..................... None
See application file for complete search history.

(56) References Cited

U.S. PATENT DOCUMENTS

| 5,777,512 A | 7/1998 | Tripathi et al. | ......... 330/207 A |
| 6,014,055 A | 1/2000 | Chester | ...................... 330/10 |
| 6,586,991 B2 * | 7/2003 | Masuda et al. | ............... 330/10 |
| 6,842,070 B2 * | 1/2005 | Nilsson | ...................... 330/10 |

FOREIGN PATENT DOCUMENTS

| JP | 4-115722 | 4/1992 |
| JP | 2001-237708 | 8/2001 |
| JP | 2002-158543 | 5/2002 |
| JP | 2002-158550 | 5/2002 |

* cited by examiner

*Primary Examiner*—Khanh Van Nguyen
(74) *Attorney, Agent, or Firm*—Oblon, Spivak, McClelland, Maier & Neustadt, P.C.

(57) ABSTRACT

In an audio amplifier having a D-class power amplifier, a noise upon muting is suppressed. A sampling rate converter circuit for sampling rate converting a digital audio signal into a digital audio signal, and a ΔΣ modulation circuit for re-quantizing the digital audio signal into a bit-reduced digital audio signal are provided. Further, a PWM modulation circuit for converting the digital audio signal into a PWM signal, and a D-class power amplifier to which the PWM signal are supplied. Still further, a dither signal forming circuit for superimposing a dither signal SDI on the digital audio signal, and a forming circuit for forming a muting signal SDET are provided. Upon muting, an input side of the sampling rate converter circuit is stopped by the muting signal SDET.

2 Claims, 3 Drawing Sheets

| SAMPLING FREQUENCY FOR SIGNAL S11 | MAGNIFICATION n |
|---|---|
| 32kHz, 44.1kHz, 48kHz | 8 TIMES |
| 96kHz | 4 TIMES |
| 192kHz | 2 TIMES |

Fig. 2

AUDIO AMPLIFIER

TECHNICAL FIELD

This invention relates to an audio amplifier.

BACKGROUND ART

In an audio amplifier, if a power amplifier of a final stage is configured with a so-called D-class amplifier, a whole is able to be digitized, and is able to be configured as a digital audio amplifier.

FIG. 3 shows one example of such digital audio amplifier. Namely, a digital audio signal S11 is supplied to an over-sampling circuit 12 from an input terminal 11, a sampling frequency thereof is over-sampled to be a digital signal S12 of 8 times, this digital signal S12 is supplied to a $\Delta\Sigma$ modulation circuit 14 through a variable attenuator circuit 13 for volume control, and is re-quantized to be bit-reduced digital signal S14. Further, this digital signal S14 is supplied to a PWM modulation circuit 15, and converted to a PWM signal S15, then this PWM signal S15 is supplied to a power amplifier 16 operating in D-class.

This power amplifier 16 is configured with a switching circuit for power amplifying by switching a power source voltage in accordance with the PWM signal S15, and a low pass filter for outputting a D/A converted and power amplified analog audio signal by smoothing the switching output. Further, by the power amplifier 16, the power amplified audio signal is supplied to a speaker 30 through an output terminal 17.

Further, in a system controller (not illustrated), a volume control signal SVOL is formed, and this signal SVOL is supplied to the variable attenuator circuit 13 as a control signal. Accordingly, when a switch for the volume control is operated, an attenuation level of the variable attenuator circuit 13 is changed, and a volume of a reproduced sound outputted from the speaker 30 is changed.

Further, in this case, the $\Delta\Sigma$ modulation circuit 14 includes a feedback loop for a quantizing error, so that even if a content of the digital signal S12 supplied from the variable attenuator circuit 13 to the $\Delta\Sigma$ modulation circuit 14 is zero, a digital signal S14 having something value is accordingly outputted from the $\Delta\Sigma$ modulation circuit 14, and the digital signal S14 is accordingly outputted from the speaker 30 as a noise sound having a specified frequency.

Consequently, in a dither signal forming circuit 18, a dither signal SDI of a minute level is formed, this dither signal SDI is supplied to the $\Delta\Sigma$ modulation circuit 14, and is superimposed on the digital signal S12 upon re-quantization. Accordingly, even in a case where the content of the digital signal S12 outputted from the variable attenuator circuit 13 is zero, an actual content of the $\Delta\Sigma$ modulation circuit 15 does not become zero, so that it is suppressed to output the noise sound.

Further, in a case when the digital signal S11 to be supplied to the input terminal 11 is switched or disconnected by the switching of the source devices supplying the digital signal S11, the synchronization of the digital signal S11 is temporary disturbed, and this disturbance of synchronization is accordingly outputted from the speaker 30 as the noise sound.

For the sake, the digital signal S11 supplied to the input terminal 11 is supplied to an asynchronous detection circuit 19, and a disturbance of synchronization of the digital signal S11 is detected. Further, this detection signal SDET is supplied to the circuits 12 to 14 as a muting signal, and when the synchronization of the digital signal S11 is disturbed, the contents of the signals S12 and S14 are set to be zero, and as the result, the reproduced sound outputted from the speaker 30 is muted.

The above is one example of an audio amplifier where the power amplifier 17 in the final stage is configured with a D-class amplifier (See Japanese Laid-open Patent Application OP2002-158543, for example).

By the way, in case of the audio amplifier as shown in FIG. 3, when a muting is performed by the detection signal SDET of the asynchronous detection circuit 19, not only the digital signal S12 is muted, but also the dither signal SDI is simultaneously muted in the $\Delta\Sigma$ modulation circuit 14. Accordingly, the dither signal SDI is abruptly cutoff upon muting, and a noise signal is generated by this abrupt cutoff, so that this is outputted from the speaker 30 as a noise sound.

Further, though the dither signal SDI has a minute level, the presence/absence of the dither signal SDI is able to be recognized as a difference in a noise level. Therefore, when the muting is set to be on, the noise level changes because the dither signal SDI is muted, but in a case where the content of the input digital signal S11 is zero (or a minute level), the change in the noise level is recognized, and this causes uncomfortable feeling.

This invention is to solve the above problems.

DISCLOSURE OF THE INVENTION

According to the present invention, an audio amplifier is configured to include, for example, a sampling rate converter circuit for performing a sampling rate conversion of a first digital audio signal with a first clock synchronized thereto and a second clock having a predetermined frequency into a second digital audio signal synchronized with the second clock, a $\Delta\Sigma$ modulation circuit for re-quantizing the second digital audio signal into a third digital audio signal having reduced number of bits, a PWM modulation circuit for converting the third digital audio signal into a PWM signal, a D-class power amplifier to be supplied the PWM signal outputted from the PWM modulation circuit, a dither signal forming circuit for superimposing a dither signal on the third digital audio signal by supplying the dither signal to the $\Delta\Sigma$ modulation circuit, and a muting signal forming circuit, wherein an input side of the sampling rate converter circuit is stopped by a muting signal upon muting.

Accordingly, the dither signal is continuously supplied to the $\Delta\Sigma$ modulation circuit even during muting, and the digital audio signal including the dither signal is supplied to the D-class power amplifier after converting into the PWM signal.

BRIEF DESCRIPTION OF THE DRAWINGS

FIG. 2 is a chart for describing the present invention.

BEST MODE FOR CARRYING OUT THE INVENTION

Figure 1:
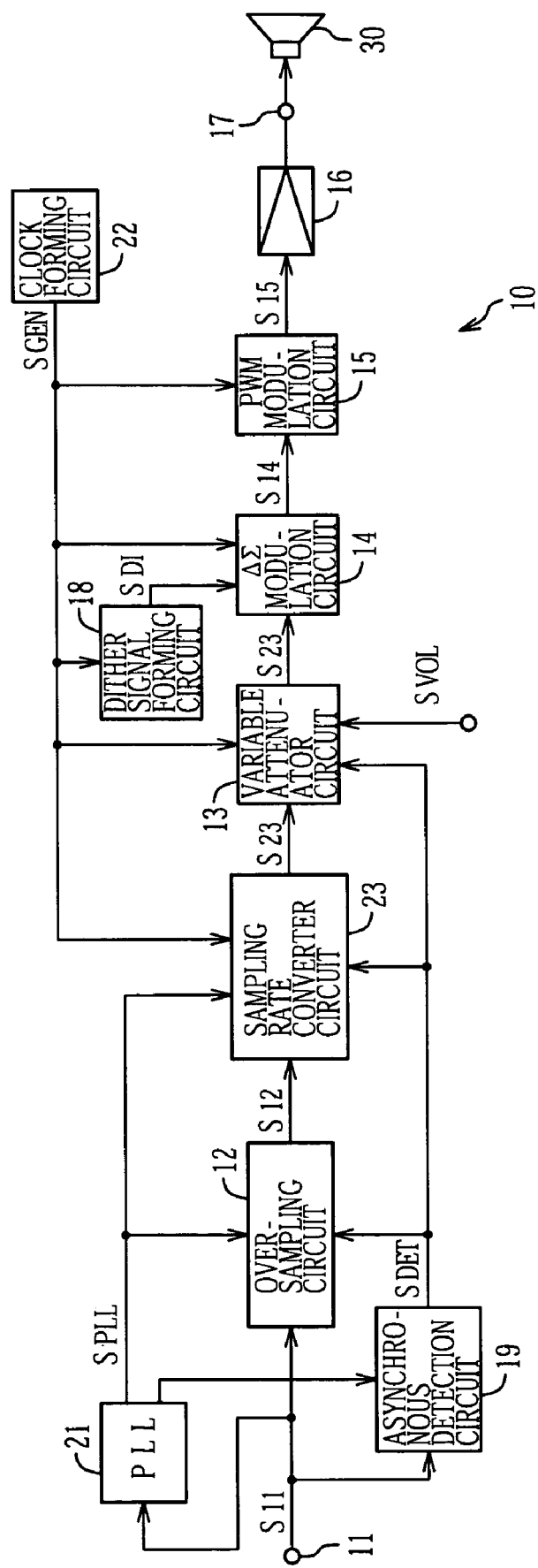
FIG. 1 is a system chart designating one mode of the present invention.
Figure 3:
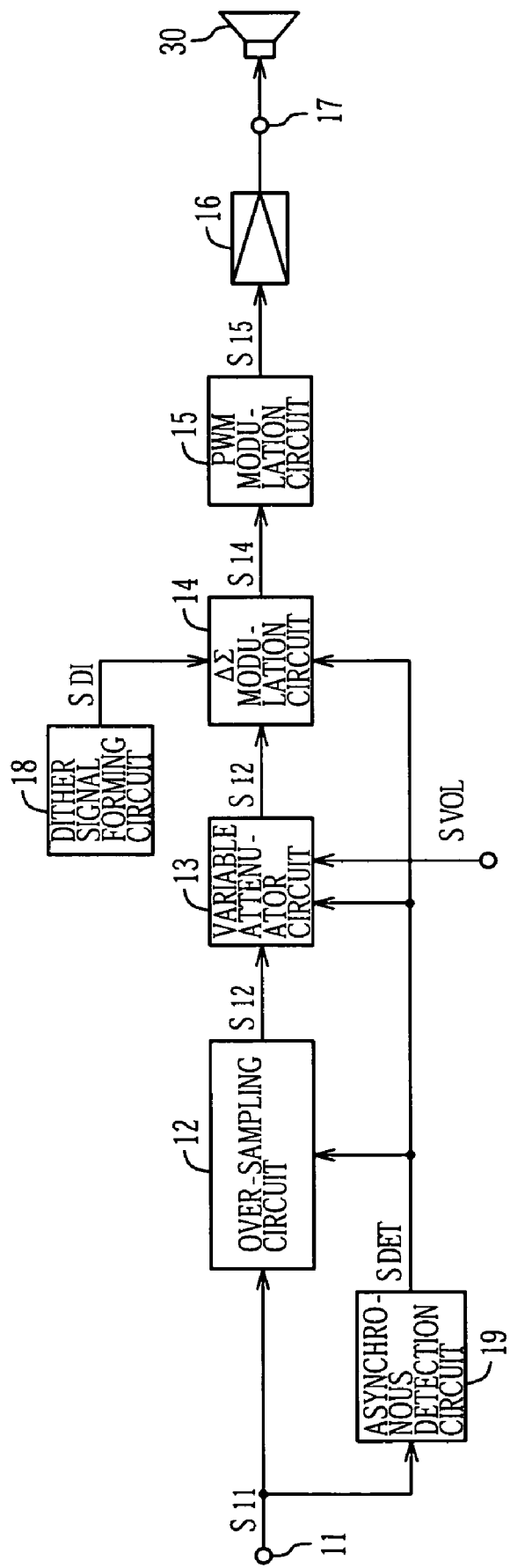
FIG. 3 is a system chart for describing the present invention.

FIG. 1 shows one example of a digital audio amplifier 10 according to the present invention, and a digital audio signal S11 is supplied to an over-sampling circuit 12 through an input terminal 11. Further, the digital signal S11 from the input terminal 11 is supplied to a PLL 21, a clock SPLL synchronized with the digital signal S11 and having a frequency of n times of its sampling frequency is formed, and thus generated clock SPLL is supplied to the over-sampling circuit 12 as a clock for over-sampling. In this case, the magnification n of the over-sampling is set to be a value as shown in FIG. 2 corresponding to the sampling frequency of the digital signal S11.

Thus, in the over-sampling circuit 12, the digital signal S11 supplied thereto is over-sampled to a digital signal S12 synchronized with the signal S11, and having a frequency of n times the sampling frequency.

And, this digital signal S12 is supplied to the sampling rate converter circuit 23 as a conversion input. Further, the clock SPLL from the PLL 21 is supplied to the sampling rate converter circuit 23 as a clock for conversion input side.

Further, the clock forming circuit 22 is configured with a crystal oscillation circuit, and a dividing circuit, and a clock SGEN having a frequency of 49.152 MHz (=48 kHz×1024) with a stable frequency and a phase is derived from this clock forming circuit 22. Then, this clock SGEN is supplied to the sampling rate converter circuit 23 as a clock of conversion output side. Thus, in the sampling rate converter circuit 23, the digital signal S12 supplied thereto is converted into a digital signal S23 having a sampling frequency which is a frequency of 384 kHz (=48 kHz×8), for example, with a stable frequency and a phase.

Then, the sampling rate converted digital signal S23 is supplied to the variable attenuator circuit 13 for the volume control, the level thereof is controlled by the control signal SVOL from the system controller (not illustrated), the level controlled digital signal S12 is supplied to the ΔΣ modulation circuit 14, and is re-quantized into a bit-reduced digital signal S14. By the way, in the dither signal forming circuit 18, the dither signal SDI of a minute level is formed at this time, and this dither signal SDI is superimposed on the digital signal S23 to be supplied to the ΔΣ modulation circuit 14.

Then, the digital signal S14 re-quantized by the ΔΣ modulation circuit 14 is supplied to the PWM modulation circuit 15, and is converted into a PWM signal S15. This PWM signal S15 is then supplied to the power amplifier 16 operating in D class, and power amplified, and after that, thus amplified output is supplied to the speaker 30 through the output terminal 17.

At this time, the clock SGEN from the forming circuit 22 is supplied to the circuits 13 to 15, and 18 as their clocks. Accordingly, the output side of the sampling rate converter circuit 23 and the circuits 13 to 15, and 18 are to be operated in synchronism with the clock SGEN.

Further, the digital signal S11 supplied to the input terminal 11 is supplied to the asynchronous detection circuit 19, also the clock having a frequency equal to the sampling frequency of the input digital signal S11 and synchronized thereto is derived from the PLL 21, this clock is supplied to the asynchronous detection circuit 19, and a disturbance of the synchronization of the digital signal S11 supplied to the input terminal 11 is detected.

Then, the detection signal SDET is supplied to the over-sampling circuit 12, an input side of the sampling rate converter circuit 23, and the variable attenuator circuit 13 as a muting signal, and when a synchronization of the digital signal S11 is disturbed, the content of the signal S12 is set to be zero, and also the operation of the input side in the sampling rate converter circuit 23 is stopped.

According to the above-mentioned configuration, the digital audio signal S11 supplied to the input terminal 11, in spite of its sampling frequency, the sampling frequency is converted its sampling rate into the digital signal having a sampling frequency of 384 kHz by the sampling rate converter circuit 23, and after that, it is power amplified after converted into the PWM signal S15, then supplied to the speaker 30.

Further, as a result of switching or disconnecting the digital signal S11 to be supplied to the input terminal 11 by the switching of the source devices supplying the digital signal S11, the synchronization of the digital signal S11 is temporary disturbed, and this disturbance of synchronization is detected by the asynchronous detection circuit 19, and by the detection signal SDET, the over-sampling circuit 12 and the input side of the sampling rate converter circuit 23 are stopped. Accordingly, the digital signal S12 is to be shut out during an interval of the detection signal SDET.

However, even the operation of the input side in the sampling rate converter circuit 23 during the interval of the detection signal SDET is stopped, the digital signal S23 is continuously outputted from the sampling rate converter circuit 23, because the output side thereof is supplied with the clock SGEN, and the operation is continuous.

However in this case, as the operation of the input side in the sampling rate converter circuit 23 is stopped and the detection signal SDET is also supplied to the variable attenuator circuit 13, the content of the digital signal S23 outputted from the variable attenuator circuit 13 is zero.

Then, such digital signal S23 is supplied to the ΔΣ modulation circuit 14, and the detection signal SDET is not supplied to the ΔΣ modulation circuit 14, during the interval of the detection signal SDET, the digital signal S14 the content of which is zero is outputted from the ΔΣ modulation circuit 14, and this digital signal S14 is supplied to the PWM modulation circuit 15. Accordingly, during the interval of the detection signal SDET, a muting is activated to the input audio signal S11. That is, the interval of the detection signal SDET is the muting interval.

As described above, the digital audio amplifier shown in FIG. 1, the muting is performed, however, even during the muting interval, the dither signal SDI is supplied to the ΔΣ modulation circuit 14, and accordingly, even if the content of the digital signal S23 supplied thereto is zero, it never happens to output from the ΔΣ modulation circuit 14 the signal components which become a noise sound of a particular frequency.

Further, even during the muting interval, the dither signal SDI is supplied to the ΔΣ modulation circuit 14, the noise levels become equal between when the muting is off and when the muting is on. Accordingly, in a case when the content of the input digital signal S11 is zero (or, a minute level), if a muting is activated, there is no fear of being recognized the change in the noise level and uncomfortable feeling.

Further, when changing from a state where the muting is off to a state where the muting is on, and when changing from a state where the muting is on to a state where the muting is off, the dither signal SDI is always continuing, so that there is no fear of generating noise signals, and also there is no fear of outputting a noise sound from the speaker 30.

(List of Abbreviations Used in this Specification)
D/A Digital to Analog
PLL: Phase Locked Loop
PWM: Pulse Width Modulation

INDUSTRIAL APPLICABILITY

According to the present invention, even if a muting is on when the content of the input digital audio signal is zero, or a minute level, there is no fear of uncomfortable feeling due to the recognition of the change in the noise level. Further, when the muting is made on from the muting off state, or when the muting is released from the muting on state, there is no fear of generating noise signals, and also there is no fear of outputting a noise sound from the speaker.

The invention claimed is:

1. An audio amplifier comprising:
   a sampling rate converter circuit for converting a sampling rate of a first digital audio signal with a first clock synchronized thereto and with a second clock having a stable and predetermined frequency into a second digital audio signal synchronized with the second clock;
   a ΔΣ modulation circuit for re-quantizing the second digital audio signal into a bit-reduced third digital audio signal;
   a PWM modulation circuit for converting the third digital audio signal to a PWM signal;
   a D-class power amplifier supplied with the PWM signal outputted from the PWM modulation circuit;
   a dither signal forming circuit for superimposing a dither signal on the third digital audio signal by supplying the dither signal to the ΔΣ modulation circuit; and
   a muting signal forming circuit; wherein
   an input side of the sampling rate converter circuit is stopped by the muting signal upon muting.

2. The audio amplifier as cited in claim 1, wherein when the first digital audio signal becomes a asynchronous state, the muting signal forming circuit is set to be a asynchronous detection circuit for detecting it, and the detection signal of this asynchronous detection circuit is set to be the muting signal.

* * * * *